(12) United States Patent
Matsuda

(10) Patent No.: US 6,437,361 B1
(45) Date of Patent: *Aug. 20, 2002

(54) SEMICONDUCTOR DEVICE AND METHOD OF USING THE SAME

(75) Inventor: Manabu Matsuda, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/035,330

(22) Filed: Mar. 5, 1998

(30) Foreign Application Priority Data

Mar. 19, 1997 (JP) .............................. 9-066793

(51) Int. Cl.$^7$ .......................................... H01L 31/0304

(52) U.S. Cl. ........................... 257/21; 257/18; 359/248

(58) Field of Search ...................... 257/18, 21; 349/248

(56) References Cited

U.S. PATENT DOCUMENTS

| | | | |
|---|---|---|---|
| 4,823,352 A | 4/1989 | Sugimoto | 372/45 |
| 5,495,360 A | * 2/1996 | Yoo | 359/248 |
| 5,569,934 A | * 10/1996 | Fujii | 257/184 |
| 5,757,023 A | * 5/1998 | Koteles | 257/18 |

OTHER PUBLICATIONS

Wan et al, "Polarization–Insensitive . . . Structures" *IEEE Photonics Tech. Lett.* vol. 6, No. 1, pp. 92–94, Jan. 1994.*
Debernandi et al, "Quantum Confined . . . Effects" *IEEE J. of Quantum Electr.* vol. 29, No. 11, Nov. 1993.*
Tanaka et al, Heavy–Hole . . . Structures *MP–22* IEEE, Jul. 1997.*
Cinguino et al *Proc. 8$^{th}$ Int Conf. Inp and Related Materials* Germany pp 184–187, "InGaAs/InGaAs . . . Amplifiers", Apr. 21, 1996.*
Hovinen et al *Conf. Proc. LEOS' 9$^{th}$ Ann. Meet. IEEE Lasers and Electro–Optics Soc.* Nov. 18, 1996 "A Novel . . . 1.55μm" pp 13–14, Nov. 18, 1996.*
Delprat D. et al.: "INTEGRATED MULTIQUANTUM WELL DISTRIBUTED FEEDBACK LASER–ELECTO-ABSORPTION MODULATOR WITH A NEGATIVE CHIRP FOR ZERO BIAS VOLTAGE", Electronics Letters, vol. 33, No. 1, Jan. 2, 1997, pp. 53–55.
Starck C. et al.: "WELL–SIZE DEPENDENCE OF ELECTRO–OPTIC EFFECTS IN GAINASP/INP QUANTUM WELLS GROWN BY GSMBE", Journal of Crystal Growth, vol. 120, No. 1/04, May 2, 1992, pp.349–352.
Matsuda M. et al.: "A NOVEL METHOD FOR DESIGNING CHIRP CHARACTERISTICS IN ELECTROABSORPTION MQW OPTICAL MODULATORS", vol. 10, No. 3, Mar. 1998, pp. 364–366.

(List continued on next page.)

Primary Examiner—Jerome Jackson, Jr.
(74) Attorney, Agent, or Firm—Armstrong, Westerman & Hattori, LLP.

(57) ABSTRACT

A semiconductor device includes a quantum well lamination structure having at least one quantum well layer and at least two barrier layers alternately laminated, the quantum well layer forming a quantum well relative to electron and hole and the barrier layer forming a potential barrier relative to electron and hole. The height of the quantum well layer and the height of the potential barrier of a valence band at the interface between the quantum well layer and the barrier layer are set so that the number of quantum levels relative to hole on the valence band side of the quantum well layer is two or three in the state that the intensity of an electric field generated in the quantum well layer is zero. The semiconductor device is provided with a means for applying an electric field in the quantum well lamination structure in a thickness direction.

10 Claims, 12 Drawing Sheets

OTHER PUBLICATIONS

Wakita K. et al.: "BLUE–CHIRP ELECTROABSORPTION MODULATORS WITH VERY THICK QUANTUM WELLS", IEEE Photonics Technology Letters, vol. 8, No. 9, Sep. 1, 1996 pp. 1169–1171.

Yamanaka T. et al.: "FIELD–INDUCED BROADENING OF OPTICAL ABSORPITON IN INP–BASED QUANTUM WELLS WITH STRONG AND WEAK QUANTUM CONFINEMENT", Applied Physics Letters, vol. 65, No. 12, Sep. 19, 1994, pp. 1540–1542.

Takayuki Yamanaka et al.: "POTENTIAL CHIRP–FREE CHARACTERISTICS (NEGATIVE CHIRP PARAMETER) IN ELECTROABSORPTION MODULATION USING A WIDE TENSILE–STRAINED QUANTUM WELL STRUCTURE" Applied Physics Letters, vol. 68, No. 22, May 27, 1996, pp. 3114–3116.

Schwedler R. et al.: "INGAAS/INP MULTIPLE QUANTUM WELL MODULATORS IN EXPERIMENT AND THEORY", Journal De Physique III, vol. 4, No. 12, Dec. 1, 1994, pp. 2341–2359.

Morito K. et al.: "A LOW–WAVELENGTH–CHIRP, LOW–DRIVE–VOLTAGE MQW MODULATOR INTEGRATED DFB LASER FOR 10 GB/S TRANSMISSION", Optoelectronics Devices and Technologies, vol. 10, No. 1, May 1, 1995, pp. 89–96.

Fells J. A. J. et al.: "CONTROLLING THE CHIRP IN ELECTROABSORPTION MODULATORS UNDER DIGITAL MODULATION", Electronic Letters, vol.30, No. 24, Nov. 24, 1994, pp. 2066–2067.

* cited by examiner

SEMICONDUCTOR DEVICE AND METHOD OF USING THE SAME

This application is based on Japanese Patent Application No. 9-66793 filed on Mar. 19, 1997, the entire contents of which are incorporated herein by reference.

BACKGROUND OF THE INVENTION a) Field of the Invention

The present invention relates to a semiconductor device and a method of using the device, and more particularly to a semiconductor device having a quantum well structure and a method of using such a device.

b) Description of the Related Art

A quantum well structure is formed by inserting a semiconductor thin film having a narrow bandgap between two semiconductor layers having a wide bandgap. The semiconductor layer having narrow bandgap is called a quantum well layer, and the semiconductor layer having a wide bandgap is called a barrier layer. A multiple quantum well structure is formed by alternately stacking a semiconductor layer having a narrow band gap and a semiconductor layer having a wide band gap.

The operation principle of a light modulator using a multiple quantum well structure will be described hereinunder.

FIG. 11A shows a band energy distribution in a quantum well as a function of position in the thickness direction. A quantum well layer L2 is sandwiched between barrier layers L1 and L3. In FIG. 11A, a kinked line Ec is a conduction band edge, a kinked line Ev is a valence band edge, a broken line $el_0$ shows a ground level of electron, and a broken line $hh_0$ shows a ground level of heavy hole.

In the state without applying a bias electric field to such a quantum well structure, a wave function $ef_o$ of electron at the ground level $el_o$ of the conduction band and a wave function $hf_0$ of heavy hole at the ground level $hh_0$ of the valence band are both symmetrical with the center of the well layer L2. The peak position of the electron wave function $ef_0$ is equal to that of the heavy hole wave function $hf_0$. If light having an energy corresponding to a difference Eg or higher between the electron ground level $el_0$ and the heavy hole ground level $hh_0$ is incident upon the quantum well structure, electron-hole pairs are generated and light is absorbed.

In FIG. 12A, a curve $a_0$ shows a wavelength dependency of an absorption coefficient in the state shown in FIG. 11A.

FIG. 11B shows the band structure when the quantum well structure shown in FIG. 11A is applied with a bias electric field along the right direction as viewed in FIG. 11A. As the electric field is applied, the band edges are slanted. The band edges of the quantum well layer L2 are slanted upper right so that electrons distribute to the left and holes distribute to the right. As the band edges are slanted, the difference Eg between the electron ground level $el_0$ and the heavy hole ground level $hh_0$ becomes small so that the absorption wavelength moves to the longer wavelength side (red shifts) corresponding to a lower energy side.

The wave functions of electron and hole shown in FIG. 11A have the same peak position if an electric field is not applied. As an electric field is applied, the wave functions shown in FIG. 11B shift in opposite directions, and as the intensity of the electric field increases, the overlap portion of the wave functions reduces. Reduction in the overlap portion of the wave functions means a lowered absorption coefficient α. Therefore, as the electric field is applied to the quantum well structure, the curve $a_0$ shown in FIG. 12A moves to the longer wavelength side, and the height of the curve $a_0$ lowers.

A curve $a_1$, shown in FIG. 12A shows the wavelength dependency of the absorption coefficient α in the state shown in FIG. 11B. As shown, the absorption coefficient α rises on the longer wavelength side than a wavelength $\lambda_0$, and light having the wavelength $\lambda_0$ is absorbed. The intensity of light having the wavelength $\lambda_0$ can therefore be modulated by controlling an electric field applied to the quantum well structure.

A charp parameter is defined by $\Delta n/\Delta k$, where $\Delta n$ is a change in the real part of a complex refractive index relative to a change in the electric field applied to a light modulator, and $\Delta k$ is a change in the imaginary part thereof. The change $\Delta k$ in the imaginary part of a complex refractive index is related to a change rate $\Delta \alpha$ of an absorption coefficient relative to a light intensity, by a relationship of $\Delta k = \lambda \Delta\alpha/4\pi$. A wavelength change $\Delta\lambda$ of a light pulse generated by modulating an applied electric field is given by $\Delta\lambda/\lambda^2 = -(\Delta n/\Delta k \times dS/dt)/(4\pi c_0 S)$, where S is a light intensity which changes with time, $c_0$ is a light velocity in vacuum. If the charp parameter is not zero, the wavelength changes with modulation of the light intensity.

A conventional electric field—absorption type light modulator has a large positive value of the charp parameter in a transparent state with a weak applied electric field and a small absorption coefficient, and takes a negative value in a non-transparent state with a strong applied electric field and a large absorption coefficient. With a conventional light modulator, the charp parameter is positive in most of an applied electric field which provides a light intensity higher than a certain level. In this case, as a light pulse rises increasing its light intensity, the wavelength of modulated light once shifts to the shorter wavelength side and then recovers its initial wavelength, whereas as a light pulse falls decreasing its light intensity, the wavelength of modulated light once shifts to the longer wavelength side and then recovers its initial wavelength. Namely, in the region having a high intensity of the light pulse, the wavelength of modulated light moves from the shorter wavelength side to the longer wavelength side during the period between the pulse leading and trailing edges.

A quartz single mode optical fiber prevailing in the field of optical fiber communications has so-called dispersion characteristics that a propagation velocity (group velocity) of a light pulse changes with the wavelength of propagating light. Although the wavelength of about 1.55 μm minimizes a propagation loss, this wavelength band has so-called abnormal dispersion characteristics that the longer the wavelength becomes, the lower the group velocity becomes. In using this optical fiber in the 1.55 μm wavelength band, since a conventional light modulator has a wavelength change, the propagation velocity at the pulse trailing edge moving to the longer wavelength side becomes lower than that at the pulse leading edge moving to the shorter wavelength side, and the pulse width is broadened during optical fiber transmission. Therefore, the higher the modulation speed becomes and the narrower the pulse width becomes, discrimination between two adjacent light pulses becomes more difficult and transmission errors are likely to occur.

If an optical fiber having such characteristics is used near at the wavelength of 1.55 μm, a charp parameter is generally desired to be as small as possible. If a negative charp parameter is realized, the light pulse width can be narrowed during optical fiber transmission as opposed to the conventional example. Therefore, transmission errors can be suppressed even if a faster signal is transmitted over a long distance.

SUMMARY OF THE INVENTION

It is an object of the present invention to provide a semiconductor device capable of generating a light pulse suitable for long distance transmission.

According to one aspect of the present invention, there is provided a semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, wherein a thickness of the quantum well layer and a height of the potential barrier of a valence band at the interface between the quantum well layer and the barrier layer are set so that the number of quantum level relative to hole on the valence band side of the quantum well layer is two or three in the state that the intensity of an electric field generated in the quantum well layer is zero; and means for applying an electric field in the quantum well lamination structure in a thickness direction.

As a bias voltage is applied to the quantum well layer, the band edges are slanted so that the energy gap lowers. Therefore, the light absorption edge wavelength red-shifts. This red shift can be used for a light modulator. As a bias voltage is applied, the wave functions of electron and hole confined in the quantum well layer shift in opposite directions. There is some range in which a value of an overlap integral of the wave function of electron at the ground level of the conduction band and the wave function of hole at the higher level of the valence band reduces as the bias voltage is increased. By using this range, the charp parameter of the quantum well layer can be made negative.

According to another aspect of the present invention, there is provided a semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, the quantum well layer having a ground level and a first higher order level for hole on the valence band side thereof; an n-type semiconductor layer in contact with one surface of the quantum well lamination structure; and a p-type semiconductor layer in contact with the other surface of the quantum well lamination structure, wherein a difference between a transition wavelength between a ground level for electron on a conduction band side of the quantum well layer and the ground level for hole on the valence band side and a transition wavelength between the ground level for electron on the conduction band side of the quantum well layer and a first higher order level for hole on the valence band side is 40 nm or smaller over the whole range from a flat band state of the quantum well lamination structure with a normal bias voltage being applied between the n-type semiconductor layer and the p-type semiconductor layer to a state with a certain reverse bias voltage being applied.

By switching between the light transparent state and the light non-transparent state in the range where the transition wavelength difference is 40 nm or shorter, the charp parameter can be made negative in the dynamic operation range.

According to another aspect of the present invention, there is provided a semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, the quantum well layer having a ground level and a first higher order level for hole on the valence band side thereof; an n-type semiconductor layer in contact with one surface of the quantum well lamination structure; and a p-type semiconductor layer in contact with the other surface of the quantum well lamination structure, wherein a value of an overlap integral of a wave function of electron at the ground level on the conduction band side of the quantum well layer and a wave function of hole at the first higher order level on the valence band side reduces as the reverse bias voltage is increased, over the whole range from a state that the bias voltage is not applied between the n-type semiconductor layer and the p-type semiconductor layer to a state with a certain reverse bias voltage being applied.

The charp parameter can be made negative in the dynamic operation range by switching between the light transparent state and the light non-transparent state in the range where a value of an overlap integral of a wave function of electron at the ground level on the conduction band side of the quantum well layer and a wave function of hole at the first higher order level on the valence band side reduces as the reverse bias voltage is increased.

According to another aspect of the present invention, there is provided a semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, the quantum well lamination structure having a ground level and a first higher order level for hole on the valence band side of the quantum well layer; an n-type semiconductor layer in contact with one surface of the quantum well lamination structure; a p-type semiconductor layer in contact with the other surface of the quantum well lamination structure; and voltage applying means for selectively applying a first bias voltage or a second bias voltage across the n-type semiconductor layer and the p-type semiconductor layer, wherein a difference between a transition wavelength between a ground level relative to electron on a conduction band side of the quantum well layer and the ground level for hole on the valence band side and a transition wavelength between the ground level for electron on the conduction band side of the quantum well layer and a first higher order level for hole on the valence band side is 40 nm or smaller over the whole range from a state applied with the first bias voltage to a state applied with the second bias voltage.

The charp parameter can be made negative in the dynamic operation range by setting the first bias voltage applied state to the transparent state and the second bias voltage applied state to the non-transparent state.

According to another aspect of the present invention, there is provided a semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, the quantum well lamination structure having a ground level and a first higher order level for hole on the valence band side of the quantum well layer; an n-type semiconductor layer in contact with one surface of the quantum well lamination structure; a p-type semiconductor layer in contact with the other surface of the quantum well lamination structure; and voltage applying means for selectively applying a first bias voltage or a second bias voltage across the n-type semiconductor layer and the p-type semiconductor layer, wherein a value of an overlap integral of a wave function of electron at the ground level on the conduction band side of the quantum well layer and a wave function of hole at the first higher order level on the valence band side reduces as the reverse bias voltage is increased, over the whole range from a state applied with the first bias voltage to a state applied with the second bias voltage.

The charp parameter can be made negative in the dynamic operation range by setting the first bias voltage applied state to the transparent state and the second bias voltage applied state to the non-transparent state.

According to another aspect of the present invention, there is provided a method of using a semiconductor device, wherein the semiconductor device comprising: a quantum well lamination structure having at least one quantum well layer-and at least two barrier layers alternately laminated, the quantum well layer forming a quantum well for electron and hole and the barrier layer forming a potential barrier relative to electron and hole, the quantum well lamination structure having a ground level and a first higher order level for hole on the valence band side of the quantum well layer; an n-type semiconductor layer in contact with one surface of the quantum well lamination structure; and a p-type semiconductor layer in contact with the other surface of the quantum well lamination structure, wherein a difference between a transition wavelength between a ground level for electron on a conduction band side of the quantum well layer and the ground level for hole on the valence band side and a transition wavelength between the ground level for electron on the conduction band side of the quantum well layer and a first higher order level for hole on the valence band side is 40 nm or smaller over the whole range from a state applied with a first bias voltage across the n-type semiconductor layer and the p-type semiconductor layer to a state with a second bias voltage larger than the first bias voltage, the second bias voltage being a reverse voltage, and the method comprising the step of applying a light flux to the quantum well structure and switching between a state that the light flux is transmitted by applying the first bias voltage and a state that the light flux is not transmitted by applying the second bias voltage.

The charp parameter can be made negative in the dynamic operation range.

According to another aspect of the present invention, there is provided a method of using a semiconductor device, wherein the semiconductor device comprising: a quantum well lamination structure having at least one quantum well layer and at least two barrier layers alternately laminated, the quantum well layer forming a quantum well for electron and hole and the barrier layer forming a potential barrier relative to electron and hole, the quantum well lamination structure having a ground level and a first higher order level for hole on the valence band side of the quantum well layer; an n-type semiconductor layer in contact with one surface of the quantum well lamination structure; and a p-type semiconductor layer in contact with another surface of the quantum well lamination structure, wherein a value of an overlap integral of a wave function of electron at the ground level on the conduction band side of the quantum well layer and a wave function of hole at the first higher order level on the valence band side reduces as the reverse bias voltage is increased, over the whole range from a state applied with a first bias voltage to a state applied with a second bias voltage larger than the first bias voltage, the second bias voltage being a reverse voltage, and the method comprising the step of applying a light flux to the quantum well structure and switching between a state that the light flux is transmitted by applying the first bias voltage and a state that the light flux is not transmitted by applying the second bias voltage.

The charp parameter can be made negative in the dynamic operation range.

As described above, a semiconductor device used as a light modulator is provided which has a negative charp parameter $\Delta n/\Delta k$ in the range from the transparent state to the non-transparent state. Accordingly, even if an optical fiber having wavelength dispersion can be used for long distance transmission.

DETAILED DESCRIPTION OF THE PREFERRED EMBODIMENTS

Figure 1:
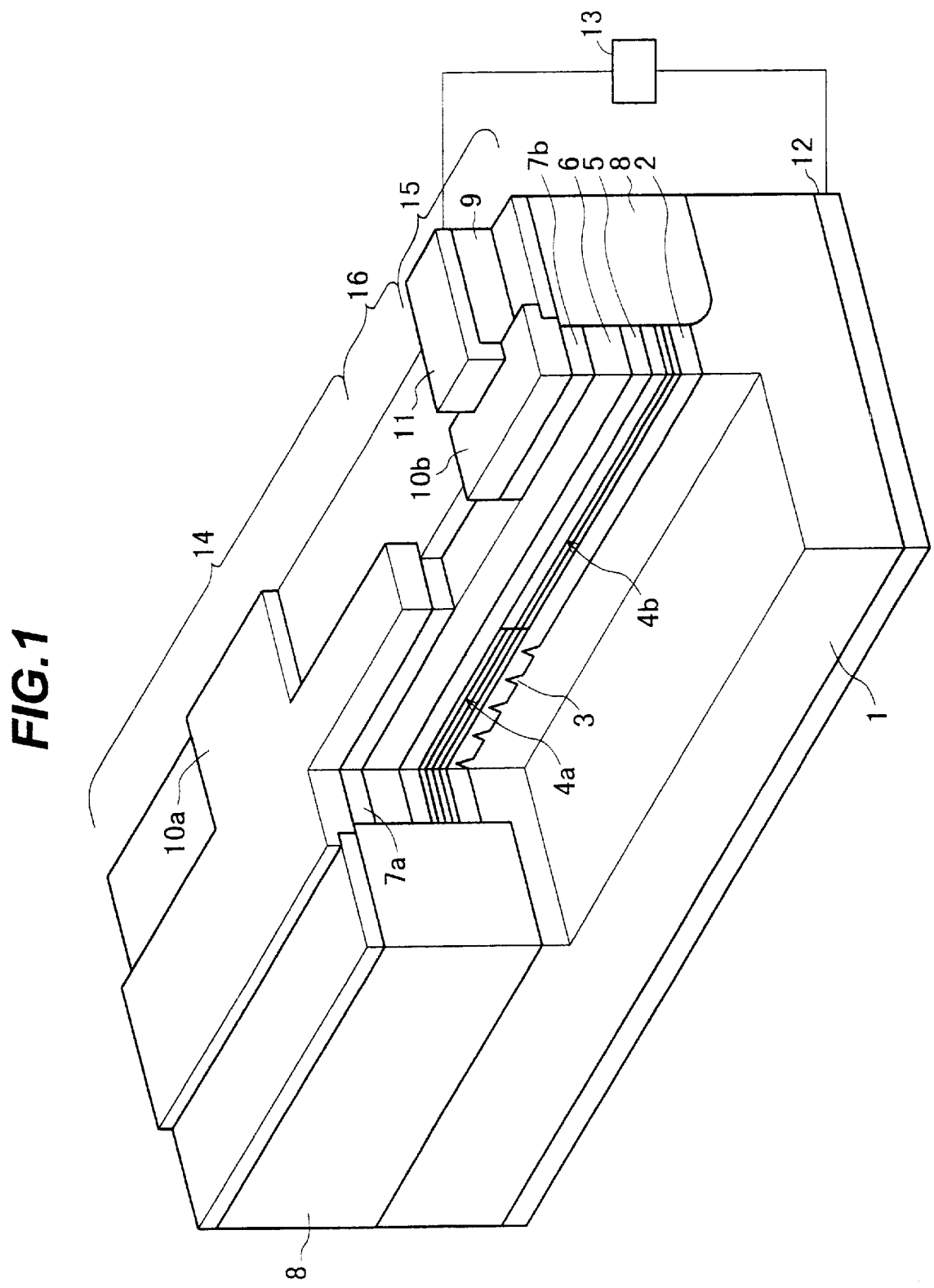
FIG. 1 is a partially broken perspective view showing a modulator integrated distributed feed-back (MIDFB) laser according to an embodiment of the invention.

FIG. 1 is a partially broken perspective view showing a modulator integrated distributed feed-back (MIDFB) laser according to an embodiment of the invention. A diffraction grating 3 is formed on a partial area of the surface of an n-type InP substrate 1. On this substrate 1, an n-type light guide layer 2 is grown on which a distributed feed-back (DFB) type laser 14 and a light modulator 15 are formed with an isolation region 16 being interposed between the laser 14 and modulator 15.

The DFB laser 14 is formed by a lamination of the n-type light guide layer 2 on the diffraction grating 3, an active layer 4a, a p-type light guide layer 5, a p-type clad layer 6, and a contact layer 7a. The light modulator 15 is formed by a quantum well structure 4b and a lamination of the p-type guide layer 5, the p-type clad layer 6 and a p-type contact layer 7b formed on the quantum well structure 4b. The quantum well structure 4b is formed by alternately laminating a quantum well layer and a barrier layer on the n-type light guide layer 2.

The isolation region 16 is formed by removing the middle regions of the contact layers 7a and 7b from the upper portion of the lamination structure.

The mesa structure of about 1 to 3 µm wide is formed by etching in the direction aligned with the DFB laser 14 and light modulator 15. The mesa structure reaches the substrate and its side regions are embedded with semi-insulating embedding semiconductor regions 8. On the contact layer 7a of the DFB laser 14, a p-side electrode 10a is formed, and on the contact layer 7b of the light modulator 15, a p-side electrode 10b is formed.

A polyimide region 9 is formed at a periphery of the p-side electrode 10b, and a wiring layer 11 formed on the polyimide region 9 is connected to the p-side electrode 10b. On the bottom of the substrate 1, a common n-side electrode 12 is formed. A voltage is applied by a voltage applying means 13 across the p-side electrode 10b and the n-side electrode 12. This voltage generates an electric field in the quantum well structure 4b in the thickness direction.

The above structure can be formed by known techniques including selective epitaxial growth on a substrate, selective etching, mesa embedding growth, substrate polishing, electrode layer deposition, patterning, cleavage, and the like.

The DFB laser 14 in this structure continuously generates light of a single wavelength. The light modulator 15 selectively absorbs light emitted from the DFB laser 14 and generates modulated output light.

Next, a charp parameter of the light modulator 15 will be described. By the Kramers-Kronig equation, the following equation (1) is given:

$$\Delta n = \frac{\lambda_0^2}{2\pi^2} \times P \int_0^\infty \frac{\Delta \alpha}{\lambda_0^2 - \lambda^2} d\lambda \quad (1)$$

where $\lambda_0$ is a wavelength of a light signal to be modulated by the light modulator having the quantum well structure, V is a bias voltage to be applied to the quantum well structure, $\alpha(\lambda, V)$ is an absorption coefficient as a function of a wavelength $\lambda$ and the bias voltage V, $\Delta \alpha = \alpha(\lambda, V)/V$, and P is an integral of a principal value.

By rearranging the equation (1), the following equation (2) is given:

$$\Delta n = \frac{\lambda_0^2}{2\pi^2} \times \left\{ P \int_0^{\lambda_0} \frac{\Delta \alpha}{\lambda_0^2 - \lambda^2} d\lambda - P \int_{\lambda_0}^\infty \frac{\Delta \alpha}{\lambda^2 - \lambda_0^2} d\lambda \right\} \quad (2)$$

Figure 12A:
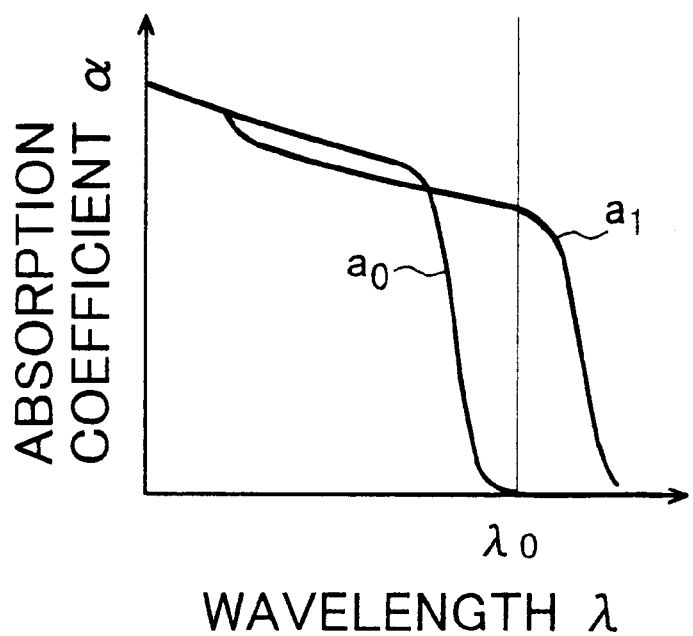
FIGS. 12A and 12B are graphs showing a wavelength dependency of an absorption coefficient $\alpha$ and an absorption coefficient change rate $\Delta\alpha$ of the quantum well structure shown in FIGS. 11A and 11B.

As shown in FIG. 12A, the wavelength $\lambda_0$ of a light signal is set to a slightly longer wavelength than the wavelength at the leading portion of the absorption coefficient $a_0$ in the flat band state. Therefore, as the bias voltage V is increased, the absorption coefficient $\alpha$ at the signal wavelength $\lambda_0$ increases because of the red shift of the leading portion wavelength. Namely, in the dynamic operation range of the light modulator, the change $\Delta k = \lambda_0 \Delta \alpha / 4\pi$ in the imaginary part of a complex refractive index becomes positive. The sign of the charp parameter $\Delta n/\Delta k$ is therefore the same as the sign of $\Delta n$. For realizing light modulation suitable for long distance transmission, the charp parameter $\Delta n/\Delta k$ is made negative in the range from the transparent state of the light modulator to the non-transparent state, as described before. Namely, the value of the equation (2) is made negative.

Both the first and second terms of the right side of the equation (2) have a positive denominator. It is therefore desirable if a most portion of the range shorter than the wavelength $\lambda_0$ has a negative $\Delta \alpha$, and a most portion of the range longer than the wavelength $\lambda_0$ has a positive $\Delta \alpha$. Further, since the denominator of each term becomes smaller as the wavelength comes near the wavelength $\lambda_0$, the value $\Delta \alpha$ near the wavelength $\lambda_0$ greatly contributes to a determination of the sign of the equation (2).

Figure 12B:
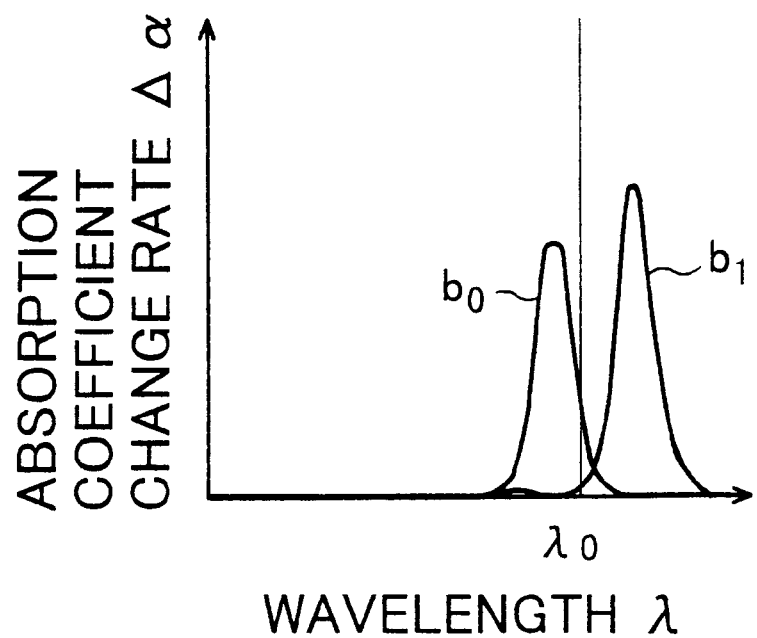

FIG. 12B shows the wavelength dependency of the change rate $\Delta \alpha$ of the absorption coefficient $\alpha$. As the applied voltage V is slightly increased in the state of the curve $a_0$ shown in FIG. 12A, i.e., in the transparent state, the curve $a_0$ slightly shifts to the longer wavelength side. The change rate $\Delta \alpha$ of the absorption coefficient with the slightly shifted curve $a_0$ is given by a curve $b_0$ shown in FIG. 12B. As shown, a large peak appears at the wavelength slightly shorter than the signal wavelength $\lambda_0$, because of the red shift of the leading portion wavelength of the absorption coefficient $\alpha$. Similarly, as the applied voltage V is slightly increased in the state of the curve $a_1$ shown in FIG. 12A, i.e., in the non-transparent state, the change rate $\Delta \alpha$ of the absorption coefficient is given by a curve $b_1$ shown in FIG. 12B. As shown, a large peak appears at the wavelength slightly longer than the signal wavelength $\lambda_0$.

The curve $b_0$ corresponding to the transparent state takes a large positive value at the wavelength shorter than the wavelength $\lambda_0$, so that the first term of the equation (2) becomes larger than the second term and the charp parameter $\Delta n/\Delta k$ becomes positive. The curve $b_1$ corresponding to the non-transparent state takes a large positive value at the wavelength longer than the wavelength $\lambda_0$, so that the second term of the equation (2) becomes larger than the first term and the charp parameter $\Delta n/\Delta k$ becomes negative.

In order to make the charp parameter $\Delta n/\Delta k$ take a negative value in the transparent state, it can be understood that the absorption coefficient change rate $\Delta \alpha$ given by the curve $b_0$ shown in FIG. 12B is required to take a large negative value at the wavelength shorter than the wavelength $\lambda_0$. As previously described with FIG. 11B, as the applied voltage V is increased, an overlap between the wave functions of electron and hole becomes small and the absorption coefficient lowers. However, since this lowered amount of the absorption coefficient is small, the absorption coefficient change rate $\Delta \alpha$ given by the curve $b_0$ shown in FIG. 12B hardly takes a negative value. It can therefore be understood that it is difficult to have a negative charp parameter $\Delta n/\Delta k$ only by transition between the ground levels of electron and hole of the quantum well layer.

The inventor has found that the charp parameter $\Delta n/\Delta k$ can be set negative by transition between the first or second higher order level (first or second level) of hole relative to the valence band of a quantum well layer and the ground level of electron relative to the conduction band. In the following, the charp parameter $\Delta n/\Delta k$ will be described by taking the higher order level of hole taking into consideration.

Figure 2:
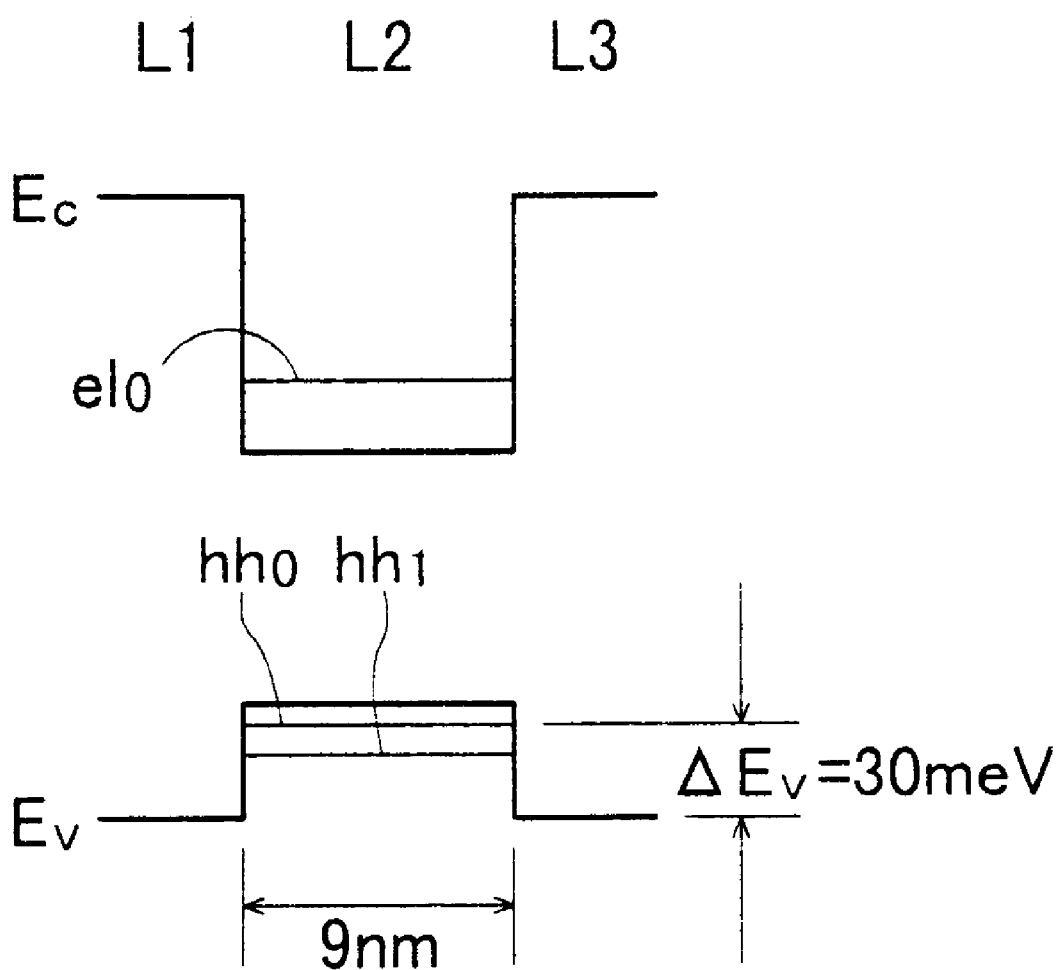
FIG. 2 is an energy band diagram of a quantum well constituting a quantum well structure.

FIG. 2 shows an example of a band structure of a quantum well layer having a ground level and a first level of heavy hole relative to the valence band. A quantum well layer L2 is sandwiched between barrier layers L1 and L3. For example, the compositions of the quantum well layer L2 are $Ga_{0.297}In_{0.703}As_{0.794}P_{0.206}$, and the compositions of the barrier layers L1 and L3 are $Ga_{0.373}In_{0.627}As_{0.711}P_{0.289}$.

The lamination structure shown in FIG. 2 corresponds to the quantum well structure 4b shown in FIG. 1. On opposite sides of the lamination structure shown in FIG. 2, an n-type semiconductor layer (corresponding to the n-type light guide layer 2 shown in FIG. 1) and a p-type semiconductor layer (corresponding to the p-type light guide layer 5) are formed. The quantum well structure shown in FIG. 2 is constituted of one quantum well layer L2 and two barrier layers L1 and L3 sandwiching the quantum well layer L2. Two or more quantum well layers may be used for forming the quantum well structure. By applying a voltage across electrodes (corresponding to the n-side and p-side electrodes 12 and 10b shown in FIG. 1) formed on the n- and p-type semiconductor layers, an electric field is generated in the quantum well lamination structure in the thickness direction.

If the thickness of the quantum well layer L2 is set to 9 nm, the quantum well layer L2 has a ground level $hh_0$ and a first higher order level $hh_1$, of heavy hole. In this case, an energy difference $\Delta E_v$ (valence band effective barrier height) between the ground level $hh_0$ of heavy hole and the valence band edge of the barrier layers L1 and L3 is 30 meV.

Figure 3A:
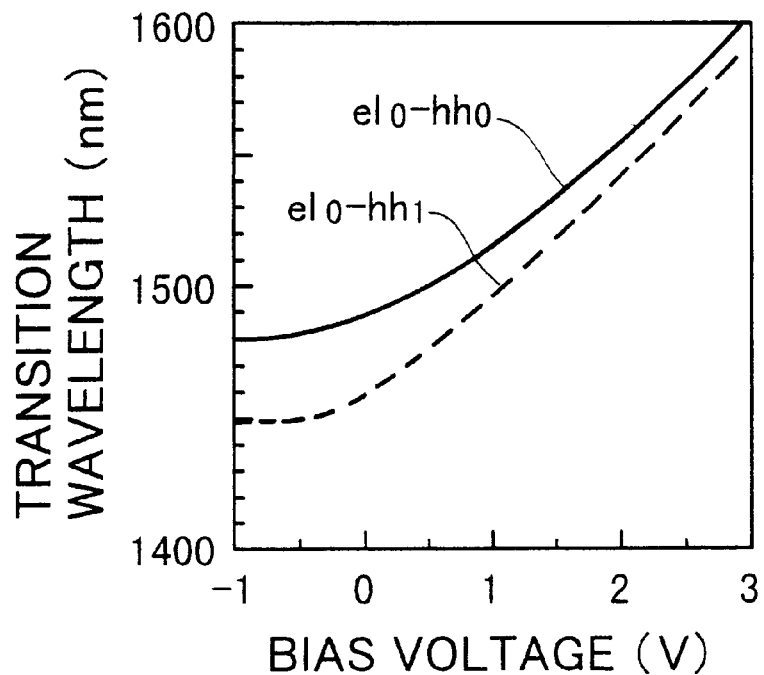
FIG. 3A is a graph showing a relationship between a transition wavelength and a bias voltage of the quantum well shown in FIG. 2.

FIG. 3A is a graph showing calculation results of a relationship between a transition wavelength and a bias voltage applied to the quantum well structure shown in FIG. 2. The abscissa represents a bias voltage in the unit of V, and the ordinate represents a transition wavelength in the unit of nm. The bias voltage of 0 V means that an externally applied voltage is 0 V and that only a built-in potential is applied to the quantum well structure. The bias voltage of $-1$ V provides the flat band state. Namely, the sign of voltage in the reverse bias direction is set positive.

The solid line shown in FIG. 3A shows a transition wavelength between the ground levels $el_0$ and $hh_0$, and a broken line shows a transition wavelength between the ground level $el_0$ and the first level $hh_1$. As the bias voltage is increased, the band ends are slanted so that the energy level difference becomes small and the transition wavelength becomes long.

Figure 3B:
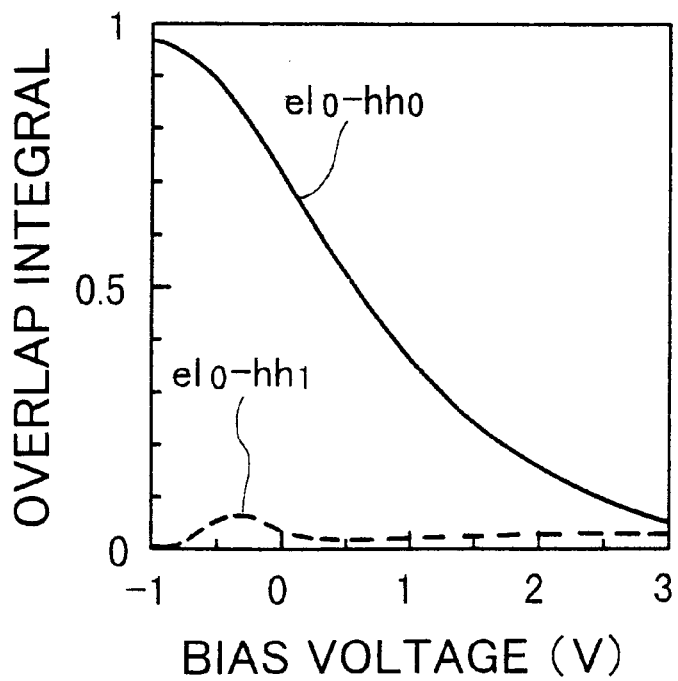
FIG. 3B is a graph showing a relationship between a bias voltage and an overlap integral of wave functions of electron and hole.

FIG. 3B is a graph showing calculation results of an overlap integral of the wave function of electron at the ground level $el_0$ and the wave function of heavy hole at the ground level $hh_0$ or first level $hh_1$. The abscissa represents a bias voltage in the unit of V, and the ordinate represents an overlap integral value in an arbitrary unit. The solid line shown in FIG. 3B shows the overlap integral of the wave functions between the ground levels $el_0$ and $hh_0$, and the broken line shows an overlap integral of the wave functions between the ground level $el_0$ and first level $hh_1$.

Figure 11A:
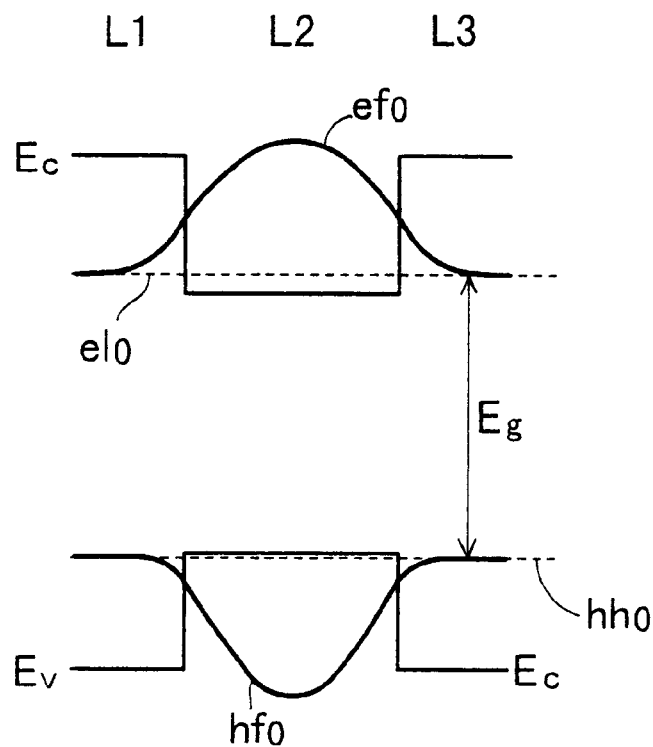
FIGS. 11A and 11B are energy band diagrams of a quantum well structure.
Figure 11B:
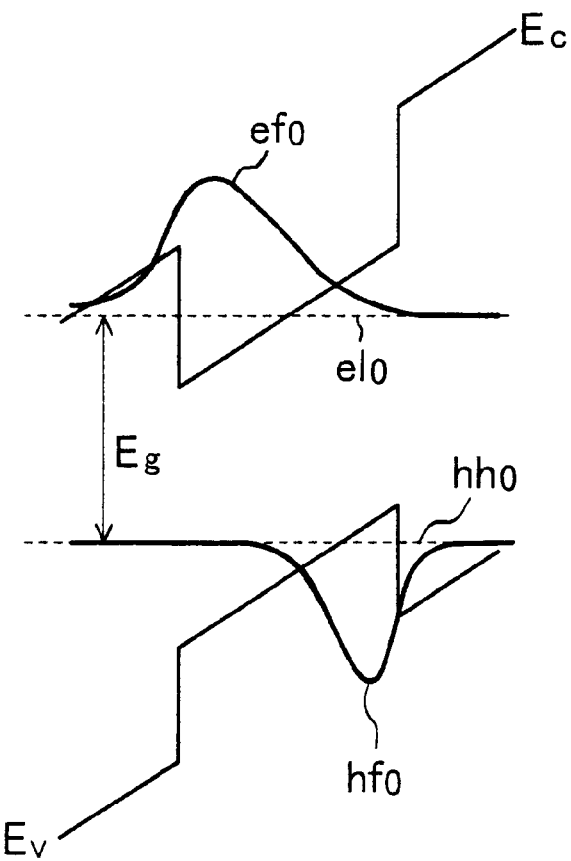

As the bias voltage is increased, the value of the overlap integral of the wave functions between the ground levels $el_0$ and $hh_0$ reduces monotonously. This is because the peak positions of the wave functions shift in opposite directions as shown in FIG. 11B. At the flat band state, i.e, at the bias voltage of $-1$ V, the value of the overlap integral between the ground level $el_0$ and first level $hh_1$, is almost zero. As the bias voltage is increased, the value of the overlap integral increases, takes a maximum value at a certain voltage, and thereafter reduces.

Next, the wavelength dependency of the absorption coefficient $\alpha$ and the absorption coefficient change rate $\Delta\alpha$ as derived from the changes in the transition wavelength shown in FIG. 3A and in the overlap integral shown in FIG. 3B, will be described qualitatively.

Figure 4A:
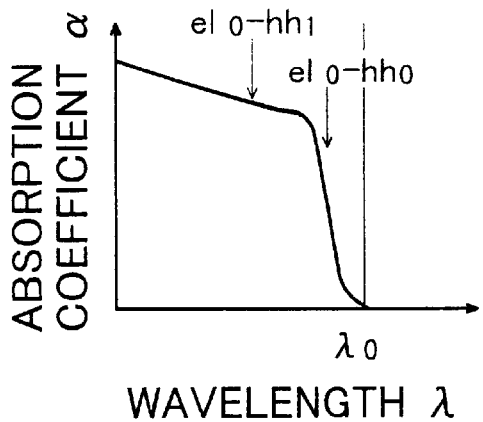
FIGS. 4A to 4F are graphs showing an absorption coefficient $\alpha$ and an absorption coefficient change rate $\Delta\alpha$ of the quantum well shown in FIG. 2, relative to a bias voltage.

FIG. 4A shows the wavelength dependency of the absorption coefficient $\alpha$ in the flat band state (bias voltage of $-1$ V). The absorption coefficient a rises at the wavelength slightly shorter than the signal wavelength (modulated wavelength) $\lambda_0$, because of absorption by the transition between the ground levels $el_0$ and $hh_0$. In the flat band state, the value of the overlap integral of the wave functions between the ground level $el_0$ and the first level $hh_1$, is zero so that absorption by the transition between these levels does not appear.

Figure 4B:
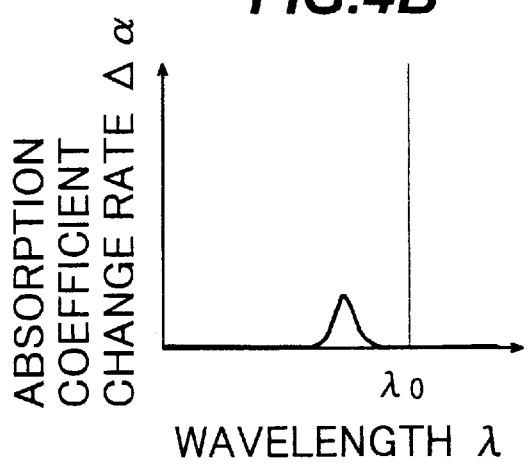

FIG. 4B shows the wavelength dependency of the absorption coefficient change rate $\Delta\alpha$ when the bias voltage is increased. As the bias voltage is increased, the transition wavelength between each pair of levels shifts to the longer wavelength side, and as shown in FIG. 3B, the value of the overlap integral of the wave functions between the ground levels $el_0$ and $hh_0$ reduces. Therefore, the curve representing the absorption coefficient $\alpha$ shown in FIG. 4A shifts to the longer wavelength side and its height lowers a little. As a result, the absorption coefficient change rate $\Delta\alpha$ becomes positive near at the rising portion wavelength of the absorption coefficient $\alpha$, and takes a small absolute value at the wavelength shorter than the leading portion wavelength.

In the integral calculation of the first term of the right side of the equation (2), the absorption coefficient change rate $\Delta\alpha$ near at the signal wavelength $\lambda_0$ greatly influences the calculation results, whereas the absorption coefficient change rate $\Delta\alpha$ at the shorter wavelength far from the signal wavelength $\lambda_0$ influences only by a small degree. Furthermore, the absolute value of the negative value of the absorption coefficient change rate $\Delta\alpha$ at the shorter wavelength side than the signal wavelength is smaller than the positive value near at the wavelength of the rising portion of the absorption coefficient $\alpha$, so that it does not greatly influence the integral calculation results. Therefore, the calculated value of the equation (2) is positive and the charp parameter $\Delta n/\Delta k$ is positive.

Figure 4C:
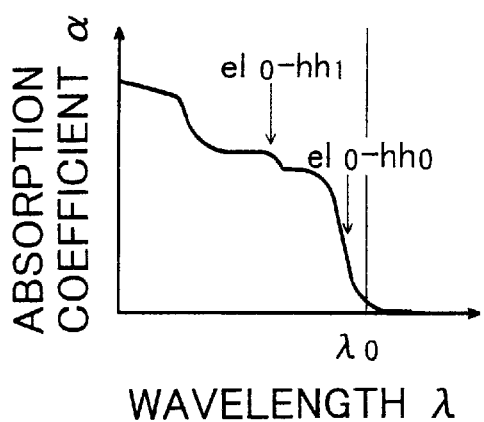

FIG. 4C shows the wavelength dependency of the absorption coefficient $\alpha$ in the state (transparent state) that a bias voltage is increased slightly from the flat band state. The absorption coefficient $\alpha$ rises at the wavelength slightly shorter than the signal wavelength $\lambda_0$, and on a shorter wavelength side thereof, a rise appears through absorption by the transition between the ground level $el_0$ and first level $hh_1$. In this case, the bias voltage is slightly higher than the voltage at which the overlap integral of the wave functions between the ground level $el_0$ and first level $hh_1$, takes a maximum value shown in FIG. 3B. Another rise at the wavelength shorter than that of the rise formed by the absorption between the ground level $el_0$ and first level $hh_1$, corresponds to the absorption end of the barrier layer.

Figure 4D:
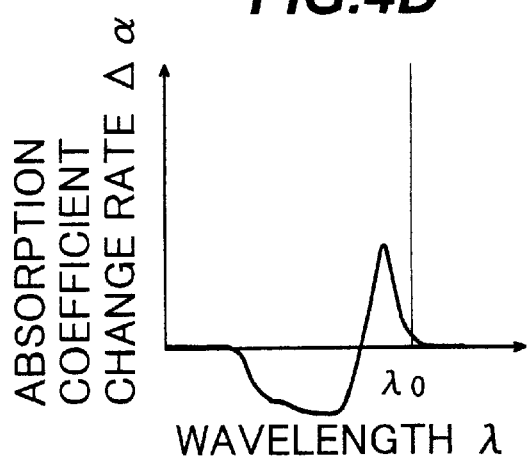

FIG. 4D shows the wavelength dependency of the absorption coefficient change rate $\Delta\alpha$ when the bias voltage corresponding to the state of FIG. 4C is applied. A peak appears at the wavelength slightly shorter than the signal wavelength $\lambda_0$, because of the red shift of the transition wavelength between the ground levels $el_0$ and $hh_0$. As the bias voltage is increased from the state shown in FIG. 4C, the overlap integral value of the wave functions between the ground level $el_0$ and first level $hh_1$, reduces as shown in FIG.

3B, so that the absorption coefficient by transition between the ground level $el_0$ and first level $hh_1$ lowers. As a result, as shown in FIG. 4D, the absorption coefficient change rate $\Delta\alpha$ becomes negative on the shorter wavelength side than the transition wavelength between the ground level $el_0$ and first level $hh_1$.

If this negative region becomes large, it greatly influences the integral of the right side first term of the equation (2) and the value $\Delta n$ becomes negative, so that the charp parameter $\Delta n/\Delta k$ becomes negative. The charp parameter $\Delta n/\Delta k$ becomes negative more easily, if a second level is present and the bias voltage range is set such that as the bias voltage increases, absorption by the transition between the ground level $el_0$ and second level $hh_2$ reduces.

Figure 4E:
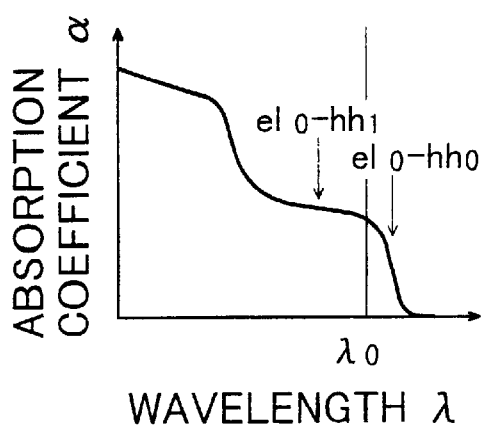

FIG. 4E shows the wavelength dependency of the absorption coefficient $\alpha$ in the state (non-transparent state) that a bias voltage is increased slightly from the state shown in FIG. 4C and the transition wavelength between the ground levels $el_0$ and $hh_0$ becomes longer than the signal wavelength $\lambda_0$. As seen from FIG. 3B, since the transition probability between the ground level $el_0$ and first level $hh_1$, becomes smaller, a rise of the absorption coefficient $\alpha$ by this transition almost disappears.

Figure 4F:
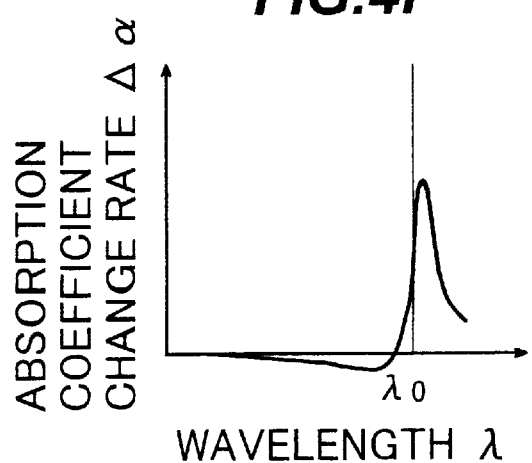

FIG. 4F shows the wavelength dependency of the absorption coefficient change rate $\Delta\alpha$ when the bias voltage is changed from the state of FIG. 4E. A peak appears at the wavelength slightly longer than the signal wavelength $\lambda_0$ because of the red shift of the transition wavelength between the ground levels $el_0$ and $hh_0$. A reduction amount of the absorption coefficient $\alpha$ by the transition between the ground level $el_0$ and first level $hh_1$, is small. Therefore, the absolute value of the negative absorption coefficient change rate $\Delta\alpha$ becomes small in the range on the shorter wavelength side than the transition wavelength. The right side second term of the equation (2) becomes dominant and the value $\Delta n$ becomes negative so that the charp parameter $\Delta n/\Delta k$ takes a negative value.

As shown in FIGS. 4D and 4F, it is possible to make the charp parameter $\Delta n/\Delta k$ negative in both the transparent and non-transparent states.

As seen from the above considerations, the following configurations are preferably used in order to make the charp parameter $\Delta n/\Delta k$ negative in both the transparent and non-transparent states.

First, the number of quantum levels of hole on the valence band side is set to two or three. If a quantum well is deep having four or more quantum levels, a change in the overlap integral of the wave functions of electron and hole is small when an electric field is applied. Therefore, the charp parameter is difficult to become negative. Absorption at the third higher order level or higher is dim just like bulk absorption so that it is difficult to make the charp parameter negative.

Second, over the whole range from the flat band state to the state a certain reverse bias is applied, a difference between the transition wavelength between the ground levels $el_0$ and $hh_0$ and the transition wavelength between the ground level $el_0$ and first level $hh_0$, has a certain value or smaller. If this difference is too large, the negative region of the absorption coefficient change rate $\Delta\alpha$ shown in FIG. 4 moves apart from the signal wavelength $\lambda_0$, so that the contribution to the integral result of the equation (2) is lowered. This transition wavelength difference is preferably set to 40 nm or smaller as will be later described.

If the valence band of a quantum well-layer has a second level $hh_2$, it is expected that the charp parameter $\Delta n/\Delta k$ becomes negative because of a lowered absorption coefficient by transition between the ground level $el_0$ and second level $hh_2$. To realize this, it is preferable that a difference between the transition wavelength between the ground levels $el_0$ and $hh_0$ and the transition wavelength between the ground level $el_0$ and second level $hh_2$ has a certain value or smaller, over the whole range from the flat band state to the state a certain reverse bias is applied. As will be later described, this difference is preferably set to 60 nm or smaller.

In the case of a quantum well layer of a light modulator, it is preferable to switch between the transparent state and the non-transparent state in the range where a difference between the transition wavelength between the ground levels $el_0$ and $hh_0$ and the transition wavelength between the ground level $el_0$ and first level $hh_1$ is 40 nm or smaller. It is also preferable to switch between the transparent state and the non-transparent state in the range where a difference between the transition wavelength between the ground levels $el_0$ and $hh_0$ and the transition wavelength between the ground level $el_0$ and second level $hh_2$ is 60 nm or smaller.

Third, it is preferable to switch between the transparent state and the non-transparent state in the range where the overlap integral value of the wave functions between the ground level $el_0$ and first level $hh_1$, reduces as the bias voltage increases. Since a light modulator having a quantum well structure is generally used in a reverse bias state, it is preferable that the overlap integral value of the wave functions between the ground level $el_0$ and first level $hh_1$, reduces as the bias voltage increases, over the whole range from a no bias voltage applied state to a certain bias voltage applied state.

Similarly, it is preferable to switch between the transparent state and the non-transparent state in the range where the overlap integral value of the wave functions between the ground level $el_0$ and second level $hh_2$ reduces as the bias voltage increases. It is also preferable that the overlap integral value of the wave functions between the ground level $el_0$ and second level $hh_2$ reduces as the bias voltage increases, over the whole range from a no bias voltage applied state to a certain bias voltage applied state.

If a first bias voltage applied state is used for the transmission state and a second bias voltage applied state is used for the non-transmission state, it is preferable that the overlap integral value reduces as the bias voltage increases over the whole range from the first bias voltage applied state to the second voltage applied state.

Next, with reference to FIGS. 5A and 5B to FIGS. 9A and 9B, a change in the charp parameter $\Delta n/\Delta k$ and an extinction ratio relative to a bias voltage will be described.

FIGS. 5A, 6A, 7A, 8A and 9A show calculation results of a change in the charp parameter $\Delta n/\Delta k$ relative to the bias voltage. The abscissa represents the bias voltage in the unit of V, and the ordinate represents the charp parameter $\Delta n/\Delta k$. FIGS. 5B, 6B, 7B, 8B and 9B show calculation results of a change in the extinction ratio relative to the bias voltage. The abscissa represents the bias voltage in the unit of V, and the ordinate represents the extinction ratio in the unit of dB relative to a reference bias voltage of −1 V. The bias voltage of −1 V corresponds to the flat band state.

Each of the calculation results is obtained under the conditions that the quantum well layer and barrier layers are made of GaInAsP and the TE mode is used having the heavy hole contribution factor of ½ and the light hole contribution factor of ⅙. The strain amount of the quantum well layer is 0.5%, the strain amount of the barrier layer is −0.3%, the thickness of the barrier layer is 5.1 nm, the number of quantum well layers is seven, the absorption end wavelength (wavelength at an inflection point of an absorption coefficient α) when no bias voltage is applied is 1490 nm, and the signal wavelength is 1550 nm. In order to make the calculation results compatible with experiments, the exciton strength is assumed to be 0.4 times the theoretical value. Increasing the exciton strength by improving crystallinity enhances a tendency of making the charp parameter negative.

Figure 5A:
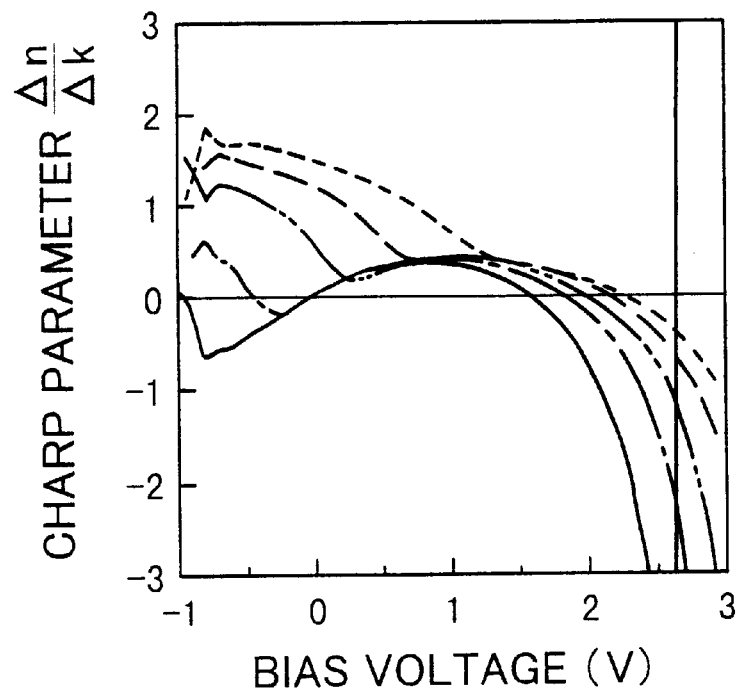
FIGS. 5A and 5B are graphs showing calculation results of a bias voltage dependency of a charp parameter $\Delta n/\Delta k$ and an extinction ratio, when the thickness of a quantum well layer is set to 6 nm.
Figure 5B:
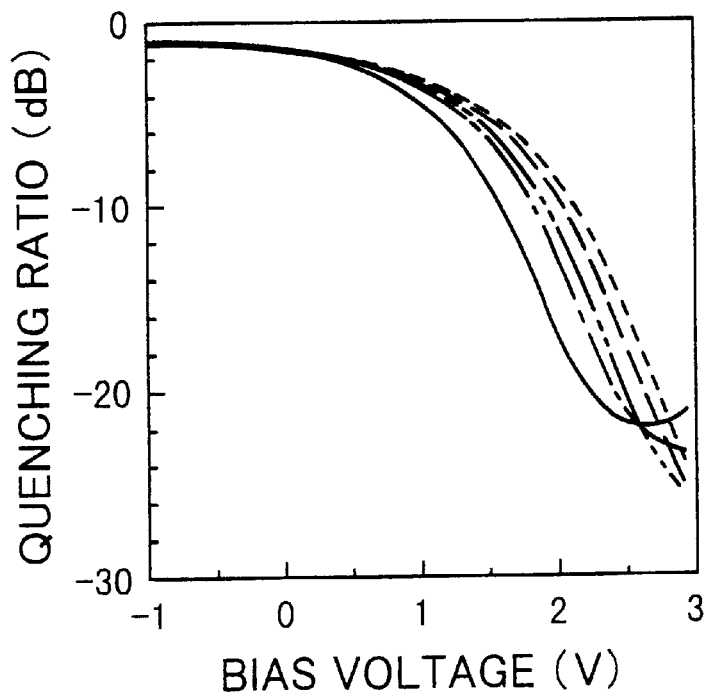
Figure 6A:
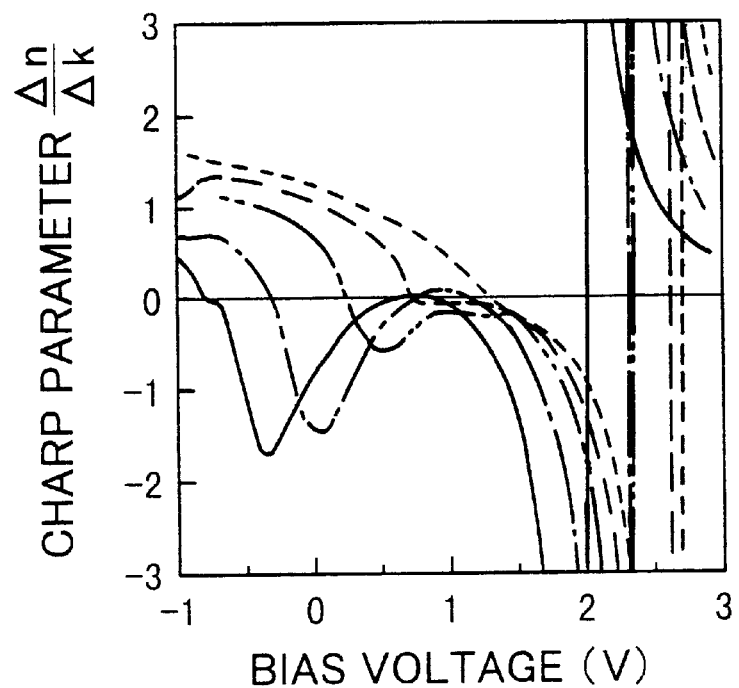
FIGS. 6A and 6B are graphs showing calculation results of a bias voltage dependency of a charp parameter $\Delta n/\Delta k$ and an extinction ratio, when the thickness of a quantum well layer is set to 7.5 nm.
Figure 6B:
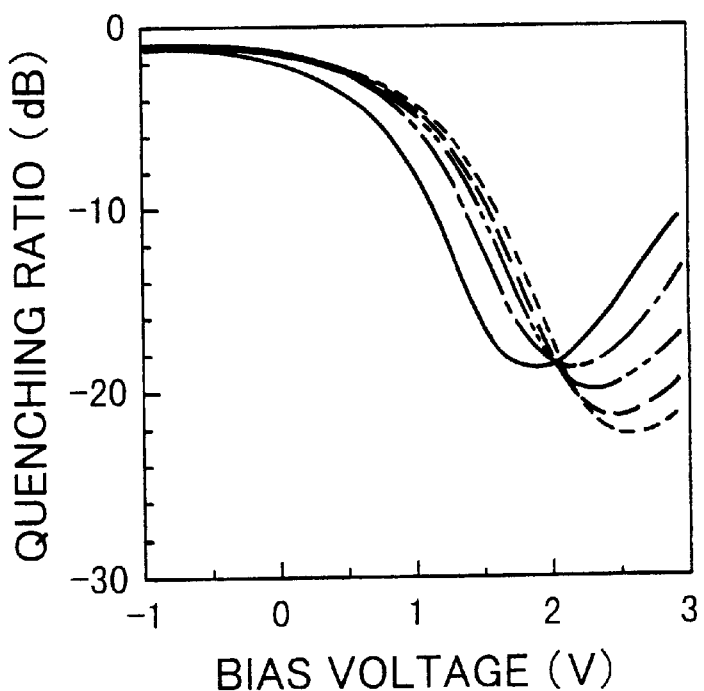
Figure 7A:
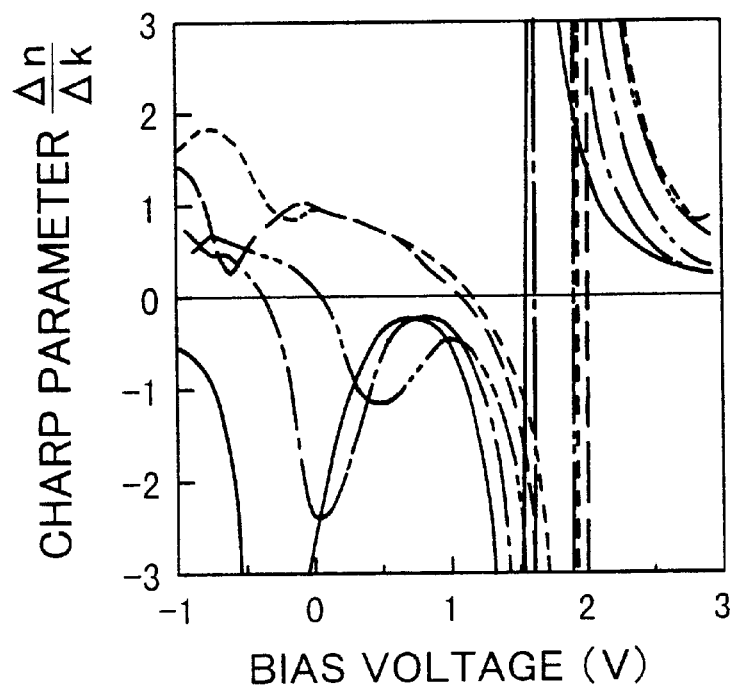
FIGS. 7A and 7B are graphs showing calculation results of a bias voltage dependency of a charp parameter $\Delta n/\Delta k$ and an extinction ratio, when the thickness of a quantum well layer is set to 9 nm.
Figure 7B:
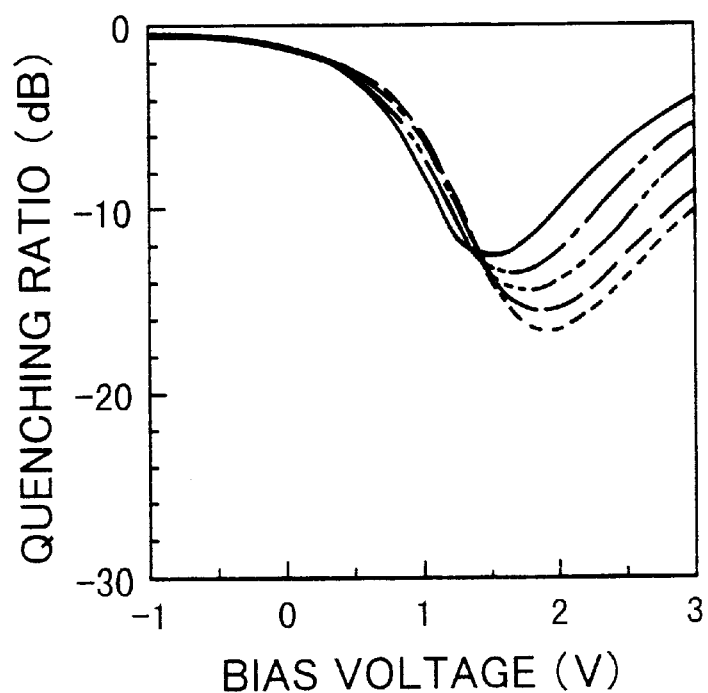
Figure 8A:
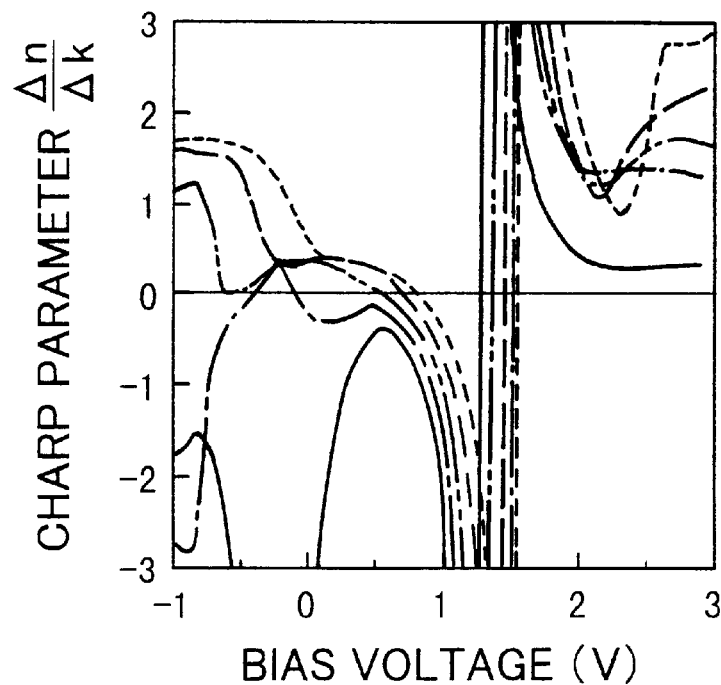
FIGS. 8A and 8B are graphs showing calculation results of a bias voltage dependency of a charp parameter $\Delta n/\Delta k$ and an extinction ratio, when the thickness of a quantum well layer is set to 10.5 nm.
Figure 8B:
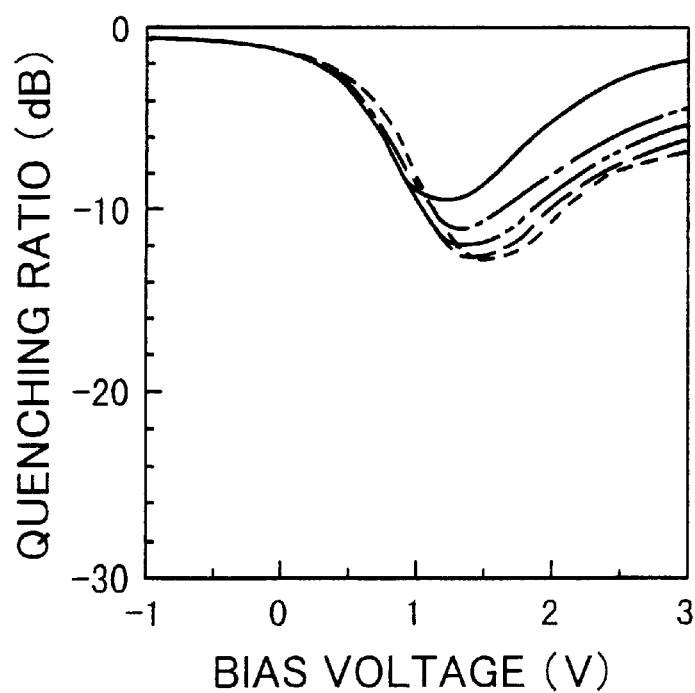
Figure 9A:
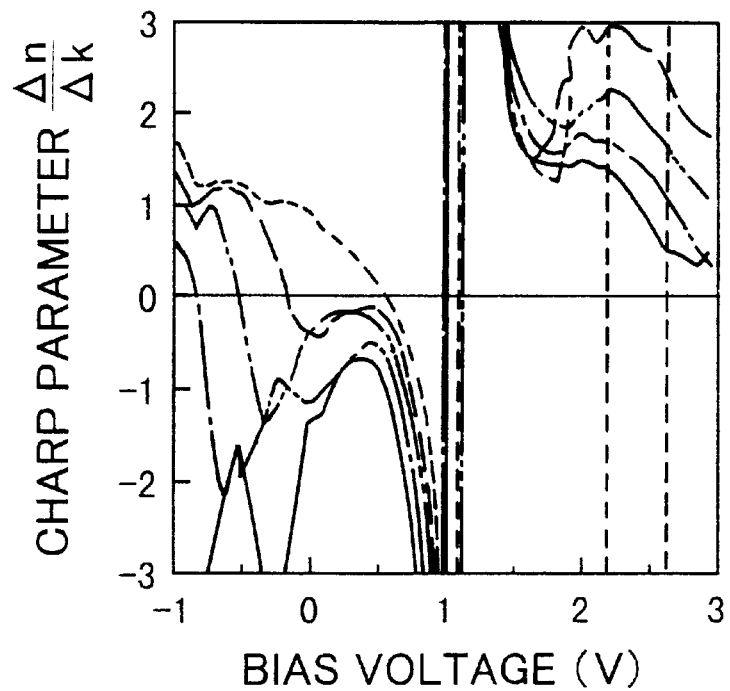
FIGS. 9A and 9B are graphs showing calculation results of a bias voltage dependency of a charp parameter $\Delta n/\Delta k$ and an extinction ratio, when the thickness of a quantum well layer is set to 12 nm.
Figure 9B:
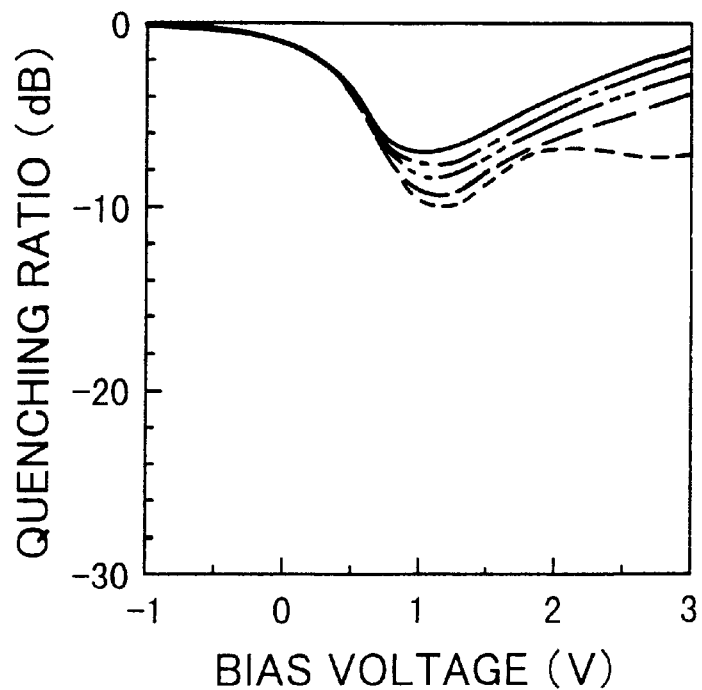

The thickness of the quantum well layers shown in FIGS. 5A and 5B is 6 nm, the thickness of the quantum well layers shown in FIGS. 6A and 6B is 7.5 nm, the thickness of the quantum well layers shown in FIGS. 7A and 7B is 9 nm, the thickness of the quantum well layers shown in FIGS. 8A and 8B is 10.5 nm, and the thickness of the quantum well layers shown in FIGS. 9A and 9B is 12 nm. In each of the graphs, a short segment broken line stands for a difference (effective barrier height of a valence band) $\Delta E_v$ of 70 meV between the ground level of the valence band of the quantum well layer and the valence band end level of the barrier layer, a long segment broken line stands for the difference of 60 meV, a two-dot chain line stands for the difference of 50 meV, a one-dot chain line stands for the difference of 40 meV, and a solid line stands for the difference of 30 meV.

If the effective barrier height $\Delta E_v$ of the valence band is smaller than 40 meV, as shown in FIGS. 6A and 6B with the quantum well layer thicknesses of 7.5 nm and 9 nm, the charp parameter $\Delta n/\Delta k$ is nearly negative in the range from the no bias applied state to a certain reverse bias voltage applied state. At the bias voltage of about 0 V, the extinction ratio is about −1 to −3 dB which corresponds to the transparent state. As the bias voltage is increased, the absolute value of the extinction ratio increases and the non-transparent state is realized. By controlling the bias voltage, it is possible to switch between the transparent state and the non-transparent state.

A change in the transition wavelength relative to the bias voltage such as shown in FIG. 3A was investigated for the structure that the charp parameter $\Delta n/\Delta k$ in the transparent state becomes negative. It was found that a difference between the transition wavelength between the ground level $el_0$ of the conduction band and the ground level $hh_0$ of the valence band and the transition wavelength between the ground level $el_0$ of the conduction band and the first level $hh_1$, of the valence band was 40 nm or smaller over the whole range from the flat band state to a certain bias voltage applied state. A difference between the transition wavelength between the ground level $el_0$ of the conduction band and the ground level $hh_0$ of the valence band and the transition wavelength between the ground level $el_0$ of the conduction band and the second level $hh_2$ of the valence band was 60 nm or smaller.

As seen from the above investigation results, in order to make the charp parameter $\Delta n/\Delta k$ negative both in the transparent state and the non-transparent state, it is preferable that each transition wavelength satisfies the above conditions.

It is not always necessary to satisfy the above conditions over the whole range from the flat band state to a certain bias voltage applied state. From a general point of view, the above conditions may be satisfied in the range from a first bias voltage applied state realizing the transparent state to a second bias voltage applied state realizing the non-transparent state.

Figure 10A:
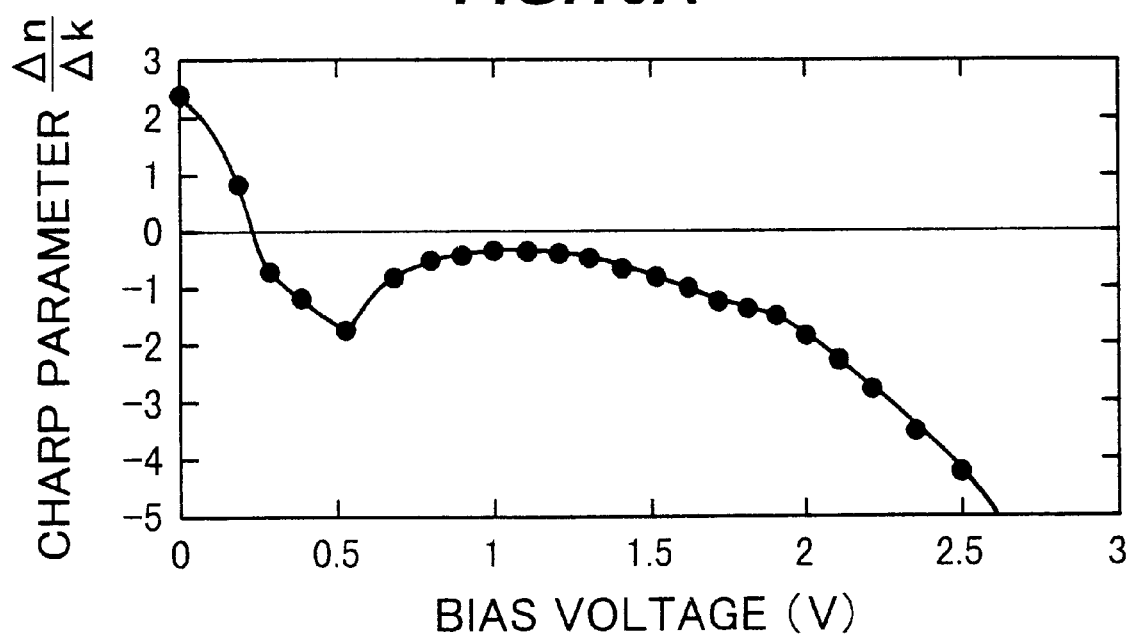
FIGS. 10A and 10B are graphs showing measurement results of a bias voltage dependency of a charp parameter $\Delta n/\Delta k$ and an extinction ratio, when the thickness of a quantum well layer is set to 9 nm.
Figure 10B:
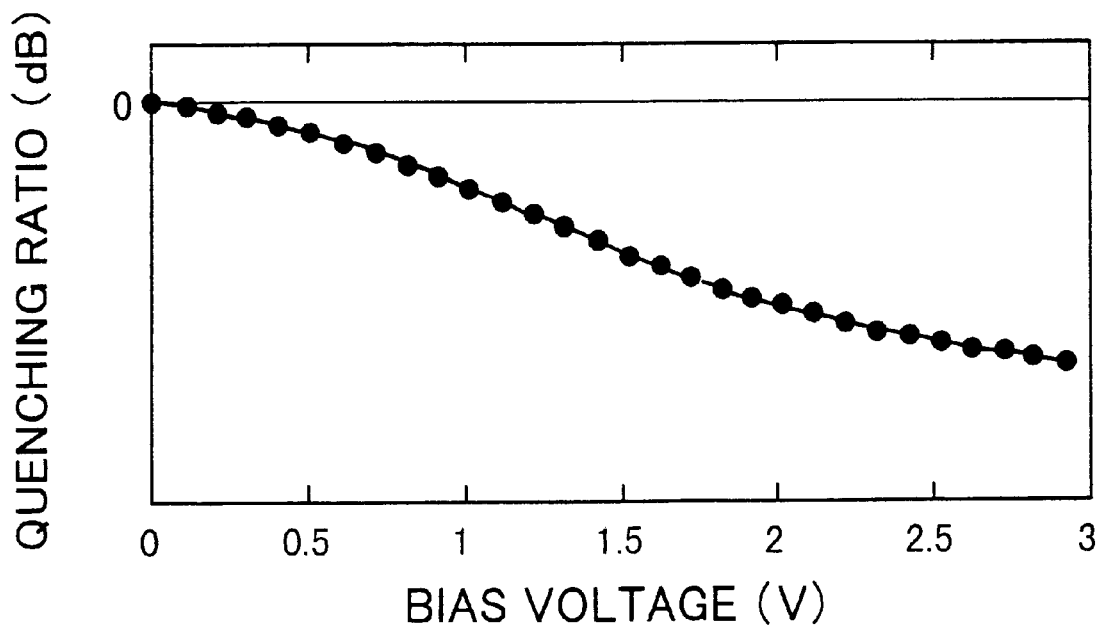

FIGS. 10A and 10B show the bias voltage dependency of the charp parameter $\Delta n/\Delta k$ of an actually manufactured quantum well structure. This structure is the same as those shown in FIGS. 5A to 9B, and the quantum well layer is 9 nm thick. The compositions of the quantum well layer are $Ga_{0.299}In_{0.701}As_{0.798}P_{0.202}$, and the compositions of the barrier layers are $Ga_{0.357}In_{0.643}As_{0.678}P_{0.322}$.

As shown in FIG. 10A, the charp parameter $\Delta n/\Delta k$ is negative in the range with the bias voltage of 0.3 V or higher. As shown in FIG. 10B, the extinction ratio is almost 0 dB near the bias voltage of 0 V, and as the bias voltage is increased, the absolute value of the extinction ratio increases. Therefore, this quantum well structure can be used as a light modulator having, for example, the transparent state at the bias voltage of about 0.3 to 0.5 V and the non-transparent state at the bias voltage of 2 V or higher.

This light modulator has a negative charp parameter $\Delta n/\Delta k$ over the whole range from the transparent state to the non-transparent state. It is therefore possible to realize light modulation suitable for long distance transmission.

In the above embodiment, the quantum well structure of GaInAsP has been described. The charp parameter $\Delta n/\Delta k$ of other quantum well structures was also calculated by changing the quantum well layer thickness and the valence band effective barrier height $\Delta E_v$, the other quantum well structures including a structure having a quantum well layer of GaAlInAs and barrier layers of GaInAsP, a structure having a quantum well layer of GaInAsP and barrier layers of GaAlInAs, and a structure having a quantum well layer and barrier layers of GaAlInAs. The calculation results showed the same conclusions as GaInAsP of the embodiment, as to the number of higher order levels of the valence band, and a difference between the transition wavelength between ground levels and the transition wavelength between the ground level and higher order level.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:

a quantum well lamination structure having at least one quantum well layer and at least two barrier layers alternatively laminated, the quantum well layer forming a quantum well for electron and hole and the barrier layer forming a potential barrier to electron and hole, the quantum well layer having a first heavy hole level and a second heavy hole level on the valence band side thereof;

an n-type semiconductor layer in contact with one surface of said quantum well lamination structure; and a p-type semiconductor layer in contact with the other surface of said quantum well lamination structure, wherein a difference between a transition wavelength between a ground level for electron on a conduction band side of the quantum well layer and the first heavy hole level on the valence band side and a transition wavelength between the ground level for electron on the conduction band side of the quantum well layer and a second heavy hole level on the valence band side is 40 nm or smaller over the whole range from a flat band state of said quantum well lamination structure with a normal bias voltage being applied between said n-type semiconductor layer and said p-type semiconductor layer to a state with a certain reverse bias voltage being applied, the quantum well layer has a third heavy hole level on the valence band side; and a value of an overlap integral of a wave function of electron at the ground level on the conduction band side of the quantum well layer and a wave function of hole at the third heavy hole level on the valence band side reduces as the reverse bias voltage is increased, over the whole range from a state that the bias voltage is not applied between said n-type semiconductor layer and said p-type semiconductor layer to a state with a certain reverse bias voltage being applied.

2. A semiconductor device comprising:

a quantum well lamination structure having at least one quantum well layer and at least two barrier layers alternately laminated, the quantum well layer forming a quantum well for electron and hole and the barrier forming a potential barrier for electron and hole, the quantum well layer having a ground level and a second heavy hole level on the valence band side;

an n-type semiconductor layer in contact with one surface of said quantum well lamination structure; and a p-type semiconductor layer in contact with the other surface of said quantum well lamination structure, wherein a value of an overlap integral of a wave function of electron at the ground level on the conduction band side of the quantum well layer and a wave function of hole at the second heavy hole level on the valence band side reduced as the reverse bias voltage is increased, over the whole range from a state that the bias voltage is not applied between said n-type semiconductor layer and said p-type semiconductor layer to a state with a certain reverse bias voltage being applied.

3. A semiconductor device according to claim 2, wherein:

the quantum well layer has a third heavy hole on the valance band side; and a difference between a transition wavelength between a ground level for electron on a conduction band side of the quantum well layer and the first heavy hole level on the valence band side and a transition wavelength between the ground level for electron on the conduction band side of the quantum well layer and the third heavy hole level on the valence band side is 60 nm or smaller over the whole range from a flat band state of said quantum well lamination structure with a normal bias voltage being applied between said n-type semiconductor layer and said p-type semiconductor layer to a state with a certain reverse bias voltage being applied.

4. A semiconductor device according to claim 2, wherein:

the quantum well layer has a third heavy hole level on the valence band side; and a value of an overlap integral of a wave function of electron at the ground level on the conduction band side of the quantum well layer and a wave function of hole at the third heavy hole level on the valence band side reduces as the reverse bias voltage is increased, over the whole range from a state that the bias voltage is not applied between said n-type semiconductor layer and said p-type semiconductor layer to a state with a certain reverse bias voltage being applied.

5. A semiconductor device comprising:

a quantum well lamination structure having at least one quantum well layer and at least two barrier layers alternately laminated, the quantum well layer forming a quantum well for electron and hole and the barrier layer forming a potential barrier to electron and hole, the quantum well lamination structure having a ground level and a second heavy hole level on the valence band side of the quantum well layer;

an n-type semiconductor layer in contact with one surface of said quantum well lamination structure;

a p-type semiconductor layer in contact with the other surface of said quantum well lamination structure; and voltage applying means for selectively applying a first bias voltage or a second bias voltage across said n-type semiconductor layer and said p-type semiconductor layer, wherein a difference between a transition wavelength between a ground level for electron on a conduction band side of the quantum well layer and the first heavy hole level on the valence band side and a transition wavelength between the ground level for electron on the conduction band side of the quantum well layer and a second heavy hole level on the valance band side is 40 nm or smaller over the whole range from a state applied with the first bias voltage to a state applied with the second bias voltage.

6. A semiconductor device according to claim 5, wherein:

the quantum well layer has a third heavy hole level on the valence band side; and a difference between a transition wavelength between a ground level for electron on a conduction band side of the quantum well layer and the first heavy hole level on the valence band side and a transition wavelength between the ground level for electron on the conduction band side of the quantum well layer and the third heavy hole level on the valence band side is 60 nm or smaller over the whole range from a state applied with the first bias voltage to a state applied with the second bias voltage.

7. A semiconductor device comprising:

a quantum well lamination structure having at least one quantum well layer and at least two barrier layers alternately laminated, the quantum well layer forming a quantum well for electron and hole and the barrier layer forming a potential barrier to electron and hole, the quantum well lamination structure having a ground level and a second heavy hole level on the valence band side of the quantum well layer;

an n-type semiconductor layer in contact with one surface of said quantum well lamination structure;

a p-type semiconductor layer in contact with the other surface of said quantum well lamination structure; and voltage applying means for selectively applying a first bias voltage or a second bias voltage across said n-type semiconductor layer and said p-type semiconductor layer, wherein a value of an overlap integral of a wave function of electron at the ground level on the conduction band side of the quantum well layer and a wave function of the second heavy hole level on the valence band side reduces as the reverse bias voltage is increased, over the whole range from a state applied with the first bias voltage to a state applied with the second bias voltage.

8. A semiconductor device according to claim 7, wherein:

the quantum well layer has a third heavy hole level on the valence band side; and a value of an overlap integral of a wave function of electron at the ground level on the conduction band side of the quantum well layer and a wave function of second heavy hole level on the valence band side reduces as the reverse bias voltage is increased, over the whole range from a state applied with the first bias voltage to a state applied with the second bias voltage.

9. A method for using a semiconductor device,
the semiconductor device comprising:
a quantum well lamination structure having at least one quantum well layer and at least two barrier layers alternately laminated, the quantum well layer forming a quantum well for electron and hole and the barrier layer forming a potential barrier to electron and hole, the quantum well lamination structure having a ground level and a second heavy hole level on the valence band side of the quantum well layer;
an n-type semiconductor layer in contact with one surface of said quantum well lamination structure; and
a p-type semiconductor layer in contact with the other surface of said quantum well lamination structure,
wherein a difference between a transition wavelength between a ground level for electron on a conduction band side of the quantum well layer and the first heavy hole level on the valence band side and a transition wavelength between the ground level for electron on the conduction band side of the quantum well layer and a second heavy hole level on the valence band side is 40 nm or smaller over the whole range from a state applied with a first bias voltage across said n-type semiconductor layer and said p-type semiconductor layer to a state with a second bias voltage larger than the first bias voltage, the second bias voltage being a reverse voltage,
the method comprising the step of applying a light flux to said quantum well structure and switching between a state that the light flux is transmitted by applying the first bias voltage and a state that the light flux is not transmitted by applying the second bias voltage.

10. A method of using a semiconductor device,
the semiconductor device comprising:
a quantum well lamination structure having at least one quantum well layer and at least two barrier layers alternately laminated, the quantum well layer forming a quantum well for electron and hole and the barrier layer forming a potential barrier for electron and hole, the quantum well lamination structure having a ground level and a second heavy hole level on the valence band side of the quantum well layer;
an n-type semiconductor layer in contact with one surface of said quantum well lamination structure; and
a p-type semiconductor layer in contact with one surface of said quantum well lamination structure,
wherein a value of an overlap integral of a wave function of electron at the ground level on the conduction band side of the quantum well layer and a wave function of second heavy hole level on the valence band side reduces as the reverse bias voltage is increased, over the whole range from a state applied with a first bias voltage to a state applied with a second bias voltage larger than the first bias voltage, the second bias voltage being a reverse voltage,
the method comprising the step of applying a light flux to said quantum well structure and switching between a state that the light flux is transmitted by applying the first bias voltage and a state that the light flux is not transmitted by applying the second bias voltage.

* * * * *